(12) United States Patent
Eiffert et al.

(10) Patent No.: US 7,810,286 B2
(45) Date of Patent: Oct. 12, 2010

(54) PHOTOVOLTAIC MEMBRANE SYSTEM

(76) Inventors: Patrina Eiffert, 121 Mistletoe Rd., Golden, CO (US) 80401; Annett Eiffert, 4960 Arboleda Dr., Fair Oaks, CA (US) 95628

( * ) Notice: Subject to any disclaimer, the term of this patent is extended or adjusted under 35 U.S.C. 154(b) by 455 days.

(21) Appl. No.: 11/933,902

(22) Filed: Nov. 1, 2007

(65) Prior Publication Data

US 2009/0113822 A1    May 7, 2009

(51) Int. Cl.
    E04D 13/18    (2006.01)
    E04D 13/17    (2006.01)
(52) U.S. Cl. .................. 52/173.3; 52/302.1; 52/408; 52/407.5
(58) Field of Classification Search ............. 52/173.3, 52/302.1, 302.3, 406.1, 407.5, 408; 136/246
    See application file for complete search history.

(56) References Cited

U.S. PATENT DOCUMENTS

| | | | | |
|---|---|---|---|---|
| 3,419,434 | A | * | 12/1968 | Colehower ............. 136/246 |
| 4,401,839 | A | * | 8/1983 | Pyle ..................... 136/251 |
| 4,674,244 | A | | 6/1987 | Francovitch |
| 4,860,509 | A | | 8/1989 | Laaly et al. |
| 4,886,554 | A | * | 12/1989 | Woodring et al. ........ 136/244 |
| 4,971,633 | A | * | 11/1990 | Beavis et al. ........... 136/246 |
| 5,316,592 | A | * | 5/1994 | Dinwoodie ............. 136/244 |
| 5,338,369 | A | | 8/1994 | Rawlings |
| 5,505,788 | A | * | 4/1996 | Dinwoodie ............. 136/246 |
| 5,582,653 | A | | 12/1996 | Kataoka et al. |
| 5,647,915 | A | | 7/1997 | Zukerman |
| 5,746,839 | A | * | 5/1998 | Dinwoodie ............. 136/251 |
| 5,935,343 | A | * | 8/1999 | Hollick ................ 136/246 |
| 6,148,570 | A | * | 11/2000 | Dinwoodie et al. ....... 52/173.3 |
| 6,553,729 | B1 | | 4/2003 | Nath et al. |
| 6,703,555 | B2 | * | 3/2004 | Takabayashi et al. ..... 136/244 |
| 6,729,081 | B2 | | 5/2004 | Nath et al. |
| 6,730,841 | B2 | | 5/2004 | Heckeroth |
| 6,818,819 | B2 | | 11/2004 | Morizane et al. |
| 6,883,290 | B2 | * | 4/2005 | Dinwoodie ............. 52/748.1 |
| 7,297,867 | B2 | | 11/2007 | Nomura et al. |

(Continued)

FOREIGN PATENT DOCUMENTS

CA    2554494    8/2005

OTHER PUBLICATIONS

Soprema, Inc. Job Profile: Energy-Saving Installation: Project Name: Valley National Bancorp Solar Roofing System.

*Primary Examiner*—Brian E Glessner
*Assistant Examiner*—Jason Holloway
(74) *Attorney, Agent, or Firm*—Holland & Hart LLP (57) ABSTRACT

A photovoltaic membrane system is provided for use on a building and, optionally, incorporated into the building envelope. One or more photovoltaic cells are provided at an upper layer of the system. A thermal barrier is disposed between the one or more photovoltaic cells and the building, isolating the two from one another. The thermal barrier may be provided as a series of wedges that are shaped and oriented to optimize electrical performance of the photovoltaic cells. An air channel assembly may be provided to ventilate heated air from beneath the one or more photovoltaic modules away from the system and the building. The system may be integrally associated with the building or removably coupled therewith. Components may be provided for assembly during installation or preassembled modules may be provided for installation.

16 Claims, 8 Drawing Sheets

U.S. PATENT DOCUMENTS

| | | |
|---|---|---|
| 7,342,171 B2 | 3/2008 | Khouri et al. |
| 7,557,290 B2 * | 7/2009 | Schripsema et al. ......... 136/243 |
| 2004/0144043 A1 | 7/2004 | Stevenson et al. |
| 2005/0072456 A1 | 4/2005 | Stevenson et al. |
| 2005/0178428 A1 | 8/2005 | Laaly et al. |
| 2006/0137733 A1 * | 6/2006 | Schripsema et al. ......... 136/246 |
| 2007/0095388 A1 | 5/2007 | Mergola et al. |
| 2008/0314434 A1 | 12/2008 | Khouri et al. |
| 2009/0113822 A1 | 5/2009 | Patrina et al. |

* cited by examiner

PHOTOVOLTAIC MEMBRANE SYSTEM

BACKGROUND

Commercial flat and low-sloped roofing systems provide moisture resistance, thermal resistance (R-value) and dimensional stability as part of the building envelope.

Flat and low-slope roof membranes fall into two main materials categories a) polymer based and b) bitumen based. Within polymer based low-slope roof systems there are two major types: Thermosets (TS), including Ethylene Propylene Diene Monomer (EPDM) and Chlorosulfonated Polyethylene (CSPE), and Thermoplastics (TP), including Poly Vinyl Chloride (PVC), Thermoplastic Polyolefin (TPO), Chlorinated Polyethylene (CPE) and Keytone Ethylene Ester (KEE). Within the bitumen based low-slope roof systems there are two categories: Built-up Roofing (BUR) including Asphalt and Coal Tar and Modified Bitumen (Mod. Bit.) including Atactic polypropylene (APP) and Styrene-Butadiene Styrene (SBS).

Membrane roof materials and systems are designed to meet the requirements of the building in specific climatic conditions and are specified based on the cost, long-term weatherability, resistance to stress caused by expansion and contraction from fluctuations in temperature, ultraviolet light resistance, solar reflectance and emittance, tensile strength, water and fire resistance, wind uplift, elongation and thermal expansion, dynamic puncture resistance and resistance to rooftop contaminants such as acid rain and air pollution. Exposure to extreme environments, ultraviolet rays and thermal stresses age the useful life of roof membrane systems.

Roof membrane systems are either mechanically fastened, ballasted, heat welded or fully adhered with adhesives and solvents. Membranes are both un-reinforced and reinforced with polyesters or fiberglass for strength and dimensional stability and available in a range of thickness from 45 mils to 90 mils. In the roofing industry, thicker roof membranes are considered more durable.

Flexible roof membranes are attached to the roof using one of three methods. Ballasted roof membranes require that the membrane material be laid directly over roof insulation or the roof deck and attached at the perimeter and held in place by gravel ballast or pavers. This system offers a low installation cost. However, the system is restricted by the weight that the roof deck is designed to support. In addition, the ballast material must be removed to locate leaks, making repairs time consuming and costly. In a second method, fully-adhered roof membranes require that the roof membrane be adhered to the roof with contact adhesive. This lightweight system yields high wind resistance and can be used with most deck types. However, fully adhered roof systems depend on the roof insulation to which they are adhered for wind uplift resistance. Roof pads are also often required in high traffic areas to prevent the compression of insulation, delamination of insulation facers, and general damage to the membrane, such as punctures and tears. In a third method, mechanically-attached roof membranes are attached to steel and wood decks with fasteners.

The Environmental Protection Agency's ENERGY STAR® Roof Products Program has established a minimum standard that requires low-slope reflective roof products to have an initial solar reflectance of at least 65 percent, and a reflectance of at least 50 percent after three years of weathering to be considered a 'Cool Roof', energy efficient or high performance roof. Cool Roofs typically incorporate bright white membranes that keep moisture out while reflecting ultraviolet and infrared radiation, protecting the underlying insulation and roofing substrate from deterioration. These Cool Roof systems reduce building energy consumption by up to 40 percent, improve insulation performance to reduce winter heat loss and summer heat gain and can potentially reduce HVAC equipment capacity requirements. The Cool Roof reflects light and heat away from the roof deck to assist with maintaining low air conditioning loads and considered an energy efficiency measure. Reflecting light off the roof membrane results in lower lifetime membrane temperatures and lengthen the life of the roofing system. The success of sustainability initiatives such as the U.S. Green Building Council's LEED rating system, have encouraged the roofing industry to develop cool roof systems that meet or exceed requirements for the U.S. EPA's ENERGY STAR® label for roofing membranes.

The term "photovoltaic" is derived from the root words "photo", meaning light, and "voltaic", meaning electricity. Sunlight, the common power source for photovoltaic systems, is composed of photons. The amount of energy in a photon is proportional to the frequency of its light. When photons strike a photovoltaic cell, the photons are either reflected or absorbed. When a photon is absorbed, its energy is transferred to an atom of the cell, where an electron leaves its normal position associated with that atom and moves into a current. A portion of the energy created is electrical, while another portion is thermal in nature.

Photovoltaic cells react to different wavelengths of light as a function of their material composition. Common photovoltaic cell materials include: single crystalline silicon, polycrystalline silicon and amorphous silicon, gallium arsenide, copper indium diselenide, cadmium telluride, dye-sensitive and nano-technologies. In addition, photovoltaic cells, laminates and modules can be composed of two or more layers of different photovoltaic materials with different wavelengths and bandwidth sensitivities to yield improved energy conversion efficiencies.

When exposed to light, photovoltaic cells increase in temperature, which affects each photovoltaic cell materials' energy conversion efficiency in a unique manner. This is measured and known as the Installed Nominal Operating Cell Temperature (INOCT). For example, the efficiency of the crystalline silicon solar cell strongly depends on its operating temperature and the efficiency of the amorphous is less affected by its operating temperature. Accordingly, thin film and flexible amorphous silicon systems have been commercially accepted and flush mounted to membrane roof systems. U.S. Pat. No. 4,860,509 and U.S. Patent Publication No. 2005/0072456 teach examples of flexible, photovoltaic material roofing assemblies, adhered to a single-ply roofing membrane. In the field, however, flexible amorphous silicon cell temperatures have been documented to exceed 77° C. (170° F.). Canadian Patent No. 2,554,494 provides an example of the use of crystalline photovoltaic cells, in a layered fashion that includes a base, flexible membrane layer, a semi-rigid support layer, the photovoltaic layer and a protective layer forming a unitary structure to be adhered directly to the roof. Each of these photovoltaic membrane systems, however, allows the transmission of heat from the photovoltaic cells to the building structure, limiting the operative efficiency and life of the photovoltaic cells and damaging the structural materials of the building and its protective envelope system.

In the field, it is known in the photovoltaic community that for each degree Celsius that a crystalline photovoltaic cell increases over its standard test conditions (STC) rated temperature, its performance goes down by 0.05% of its rated power. Additionally, when photovoltaic cells are integrated into an insulated roof system, there is little opportunity for heat loss off the backside of the modules and this heat is transferred into the building envelope.

Most crystalline silicon based PV arrays exhibit a relative efficiency temperature sensitivity of 0.5%/1° C. It is estimated that thin film amorphous silicon and cadmium arrays, although not as well documented due to their newness in the field, exhibit less than half of the performance temperature sensitivity of crystalline photovoltaic arrays. SANDIA National laboratory conducted a study that states that, "maintaining an open rack air flow results in 20° C. reduction in average operating temperature, a nearly a 10% greater amount of annual energy (for crystalline silicon), and an untold increase in life expectancy compared to direct mounted arrays on an insulated roof surface." Unfortunately, photovoltaic specialists have focused on the photovoltaic's INOCT and have not addressed the architectural impact of the increase of cell temperature on the roof system beneath, the heat transfer impact on the buildings thermal performance or the integrity of the building envelope.

Since the late 1980's, building integrated photovoltaic (BIPV) technology and systems have been developed as part of a movement towards whole building design and the efficient, sustainable use of resources. The objective of BIPV technology is to have one system that serves as the protective building envelope and also generates electric power for use within the building in the form of electric roof membranes, electric windows and glazing, electric awnings, electric roof tiles, electric standing seam metal roofing and the like. U.S. Pat. No. 6,553,729 and U.S. Pat. No. 6,729,081 teach examples of photovoltaic modules that are adhered directly to a roof, wall or other portion of the building structure using an adhesive. These photovoltaic systems generate on-site distributed electric power that will offset building electrical loads, decrease building electrical demand, put less demand stress on the local utility transmission system, allow surplus power to be fed back into the utility grid and may provide continuous power supply during utility grid outage.

Photovoltaic membrane roof systems installed on low-sloped roofs may be attached to the roof using mechanical fasteners, ballast or adhesives. As the photovoltaic cell heats up, thermal energy is trapped behind its surface, against the roof membrane, insulation board and deck beneath the photovoltaic cell. Over time, the photovoltaic system effectively stresses and ages the building system underneath establishing a core physical incompatibility of a direct interface between the two systems. Accordingly, prior art systems that directly attach photovoltaic systems to roof decks tend to reduce the performance life of the building materials by elevating temperatures in the building envelope system. Elevated temperatures accelerate and increase the degradation rates of most materials. A common rule of thumb for polymers states that the material life expectancy is reduced by half for each 10° C. rise in average temperature.

Photovoltaic systems mounted directly onto the building envelope trap heat into the roof deck creating a series of hot spots or heat islands on the roof which not only stresses and accelerate the aging of the roof membrane and deck underneath but negatively affecting the building's energy system. The trapped thermal energy can result in greater heat transfer to the building interior and produce a greater demand for air conditioning, which results in a strain on both operating costs and the electric power grid. Such systems further inhibit the ability of the roof insulation to work optimally, in effect requiring that air conditioning loads increase, due to the photovoltaic system. This is inconsistent with the objective of using the photovoltaic system.

SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

A photovoltaic membrane system is provided for use on a building and, optionally, incorporated into the building envelope. It is a low profile, lightweight, photovoltaic integrated membrane system that inhibits the transfer of heat from the photovoltaic cells to the building envelope or interior building materials and space, without trapping the thermal energy behind the photovoltaic cell, laminate or module.

One or more photovoltaic cells, laminates or modules are provided at an upper layer of the system. A thermal barrier is disposed between the one or more photovoltaic cells and a structural member of the building, such as a roof deck. The thermal barrier is positioned to isolate the one or more photovoltaic modules from the building envelope. The thermal barrier may be provided as a series of wedge shapes, incorporated within the membrane system, sloped and spaced in rows, in a manner to optimize the electrical performance of the photovoltaic membrane assembly for the building. An air channel assembly may be disposed between the one or more photovoltaic cells, laminates or modules and the thermal barrier to ventilate heated air from beneath the one or more photovoltaic cells away from the system and the building.

In one aspect, the thermal barrier is formed from a light weight material that substantially inhibits thermal transmission from the one or more photovoltaic modules to the building envelope. A roof membrane layer may be disposed between the one or more photovoltaic modules and the roof deck. A layer of roofing membrane may be disposed between the thermal barrier and the roof deck. Another aspect sandwiches the thermal barrier between layers of roofing membrane. Still another aspect may simply dispose a layer of roofing membrane between the one or more photovoltaic modules and the thermal barrier.

An air channel assembly may be disposed between the one or more photovoltaic modules and the thermal barrier, be part of the photovoltaic module, or be provided as part of the thermal barrier. The air channel assembly may be provided to have at least one air channel that is positioned to direct heated ambient air within the air channel assembly away from the photovoltaic system.

The system may be provided in an assembled form that may be permanently or removably coupled with the envelope of a building. In another aspect, the system may be provided in component parts to be assembled at the building during installation. In one aspect, roofing membrane may be provided with markings to indicate where photovoltaic modules and thermal barriers should be located with respect to the roofing membrane, prior to installing the system on the building.

These and other aspects of various embodiments of the present invention will be apparent after consideration of the Detailed Description and Figures herein.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense.

In one aspect, the photovoltaic membrane system 10 disposes a thermal barrier 12 between one or more photovoltaic cells 14 and the roof deck 16 of a building 18 to which the photovoltaic membrane system 10 is coupled. The thermal barrier 12 of the photovoltaic membrane system 10 serves as a physical separation barrier. Specifically, thermal barrier 12 is positioned to significantly limit heat transfer from the photovoltaic cells 14 to the building 18, its interior spaces, and its envelope that may include: a protective roof membrane 20, insulation 22, and roof deck 16. The thermal barrier 12 may also be formed from materials that embody fire resistance properties to provide additional protection to the roof of the building 18.

The thermal barrier 12 may be formed from a variety of materials that include: thermoset polymers; thermoplastics; extruded or molded copolymers; foam; rigid closed cell polyisocyanurate foam core; gypsum glass mat board; fiberglass; fiber board; vapor retardant; slipsheet; flame retardant; cap sheet; or some combination of the aforementioned materials. Each of the aforementioned materials possess similar qualities that individually or in combination retard the transfer of heat and can withstand wide variations in temperature and weather conditions present in most climates.

Figures 6A, 6B, 6C, 6D:
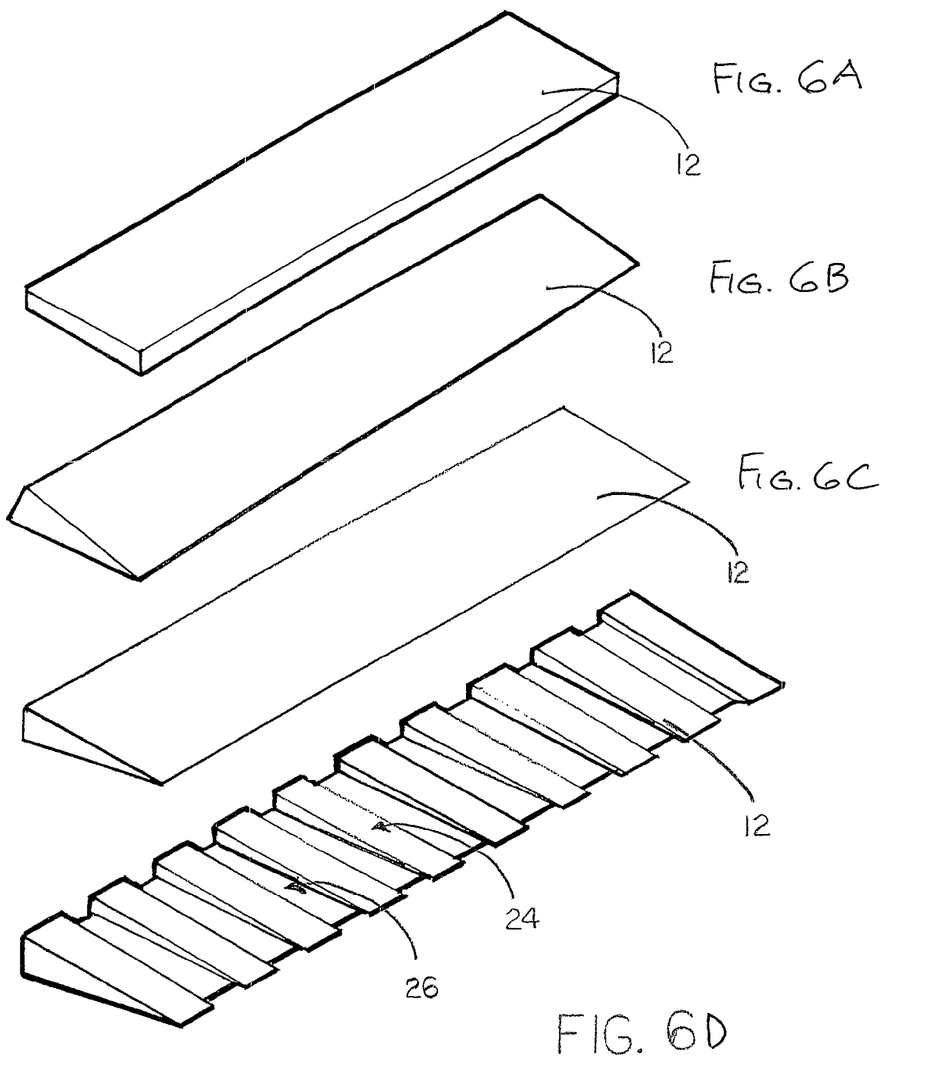
FIGS. 6A-6D depicts various different embodiments of thermal barriers that may be used with the photovoltaic membrane system.

With reference to FIG. 6, the thermal barrier 12 may be shaped to resemble a low-profile, flat wedge or low-profile tapered wedge. The exterior perimeter walls of the thermal barrier may be aerodynamically shaped to direct airflow and minimize wind forces on the photovoltaic membrane system 10. One or more peaks 24 and valleys 26 may be formed into the thermal barrier 12 to provide a profile resembling that depicted in the bottom of FIG. 6. The peaks 24 of the thermal layer 12 are formed to support the photovoltaic cells 14, angled and sloped to increase the electrical performance of the solar cells, whereas the valleys 26 form channels that permit the flow of fluids, such as air or water between one or more photovoltaic cells 14 and the thermal barrier 12. Accordingly, the spaces formed between the one or more photovoltaic cells 14 and the valleys 26 of the thermal barrier 12 will promote thermal isolation between the photovoltaic cells 14 and the building 18. Such spaces will form insulative barriers utilizing natural convection air flow. The warmed ambient air will escape into the environment or may be directed into conduits that collect the warm air for uses within the building 18.

Figures 8A, 8B, 8C:
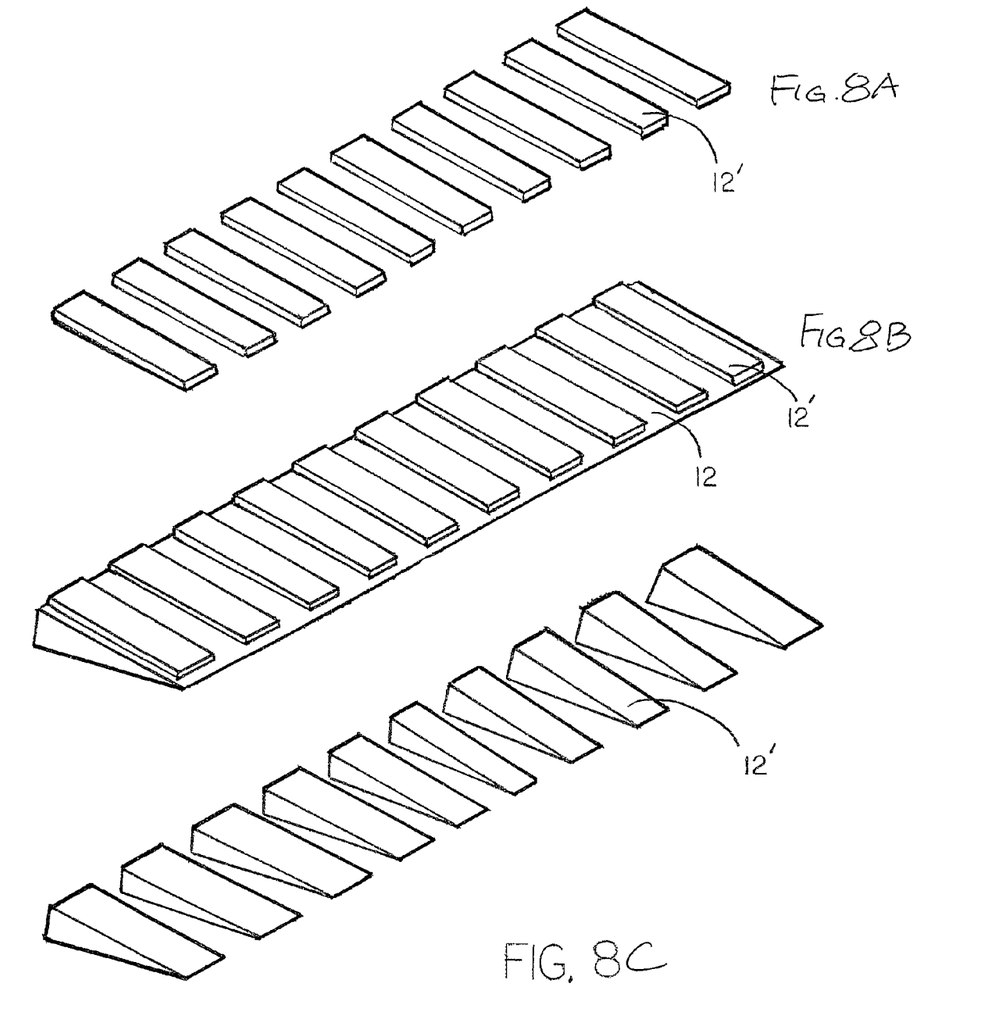
FIGS. 8A-8C depicts various different embodiments of thermal barriers and thermal barrier units that may be used with the photovoltaic membrane system.

With reference to FIG. 8, it is contemplated that the thermal barrier could be provided as a plurality of separate thermal barrier units 12'. In one aspect, the thermal barrier units 12' may be provided as low-profile blocks, having little or no slope to their shape, such as those depicted in the top of FIG. 8. In another aspect, the thermal barrier units 12' may be shaped to take the form of individual tapered wedges, such as those depicted near the bottom of FIG. 8. While such thermal barrier units 12' may be used as the sole thermal barrier 12, they may also be used in combination with the previously described thermal barrier 12, such as depicted in the middle of FIG. 8. In any of the contemplated arrangements that use the thermal barrier units 12', air channels (such as those previously described are provided between the thermal barrier units 12' once they are in their final assembly position.

Figures 7A, 7B:
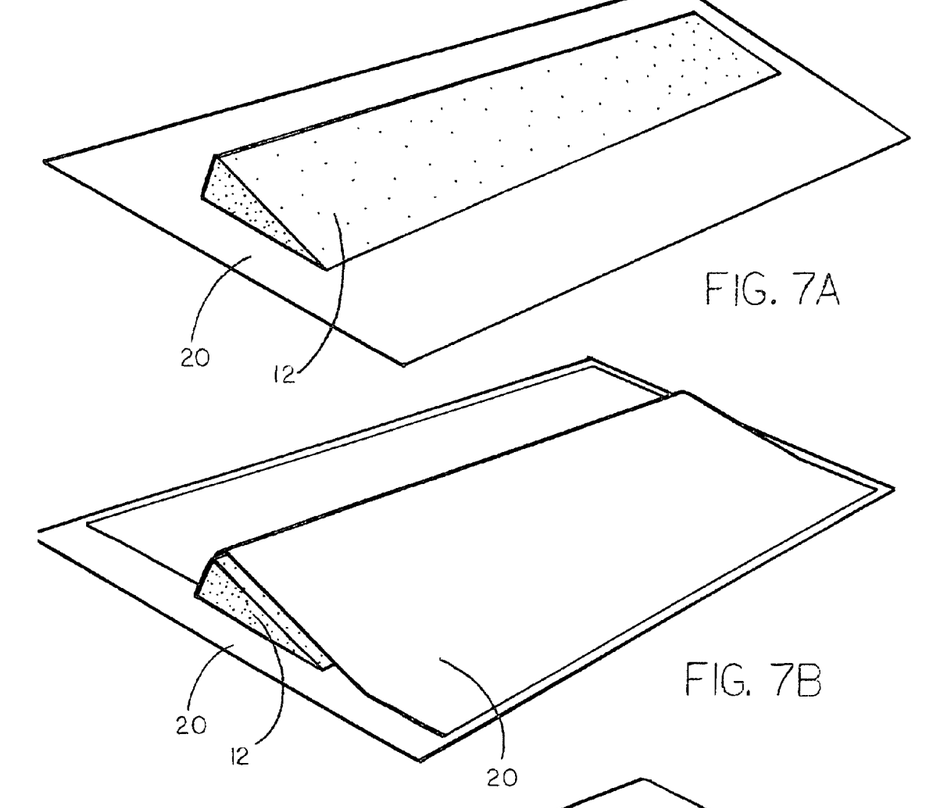
FIG. 7A depicts one manner in which the thermal barrier of the photovoltaic membrane system can be coupled with a building.
FIG. 7B depicts another manner in which the thermal barrier of the photovoltaic membrane system can be coupled with a building.
Figure 7C:
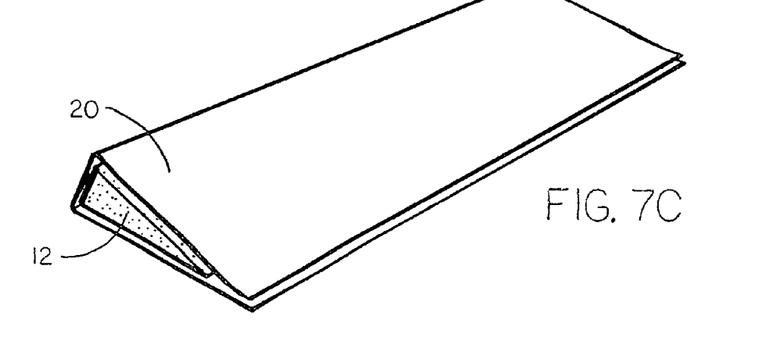
FIG. 7C depicts still another manner in which the thermal barrier of the photovoltaic membrane system can be coupled with a building.

With reference to FIGS. 7A, 7B and 7C, the thermal barrier 12 may be coupled with the roof of the building 18 in various different manners. For example, FIG. 7A depicts one manner in which the thermal barrier 12 may be coupled with a roof by positioning the thermal barrier 12 directly on a roof membrane surface 20. FIG. 7B, depicting an alternate embodiment, demonstrates that the thermal barrier 12 may be placed between two or more layers of roof membrane material 20. In still another alternate embodiment, FIG. 7C demonstrates that the thermal barrier 12 may be placed under a layer of roofing membrane 20, onto the roof deck 16. In one particular embodiment, it is envisioned that the thermal barrier 12 may be provided as interlocking preformed insulation boards that are coupled with the roof, beneath the roofing membrane 20.

The photovoltaic cells 14 of the photovoltaic membrane system 10 are preferably formed into arrays shaped as rows. Specifically, low-profile, flat solar panels may be spaced in rows closely adjacent one other. Alternatively, low-profile, tapered wedge shape panels are laid out in rows at a predetermined space between rows to avoid one row of solar panels from shading the next row to optimize electrical performance.

The thermal barrier 12 may be provided with a reflective layer 28 to enhance the thermal protection afforded by the thermal barrier 12. In one aspect, the reflective layer 28 may be provided in the form of a bright white reflective surface or reflective metal material. By providing such a reflective layer 28, heat radiated from the photovoltaic cell 14 is reflected back toward the photovoltaic cell 14, away from the building 18. Where an air channel assembly 30 is provided, the reflected heat may be passed away from the building 18 and the photovoltaic system through the air channel assembly 30.

Figure 1:
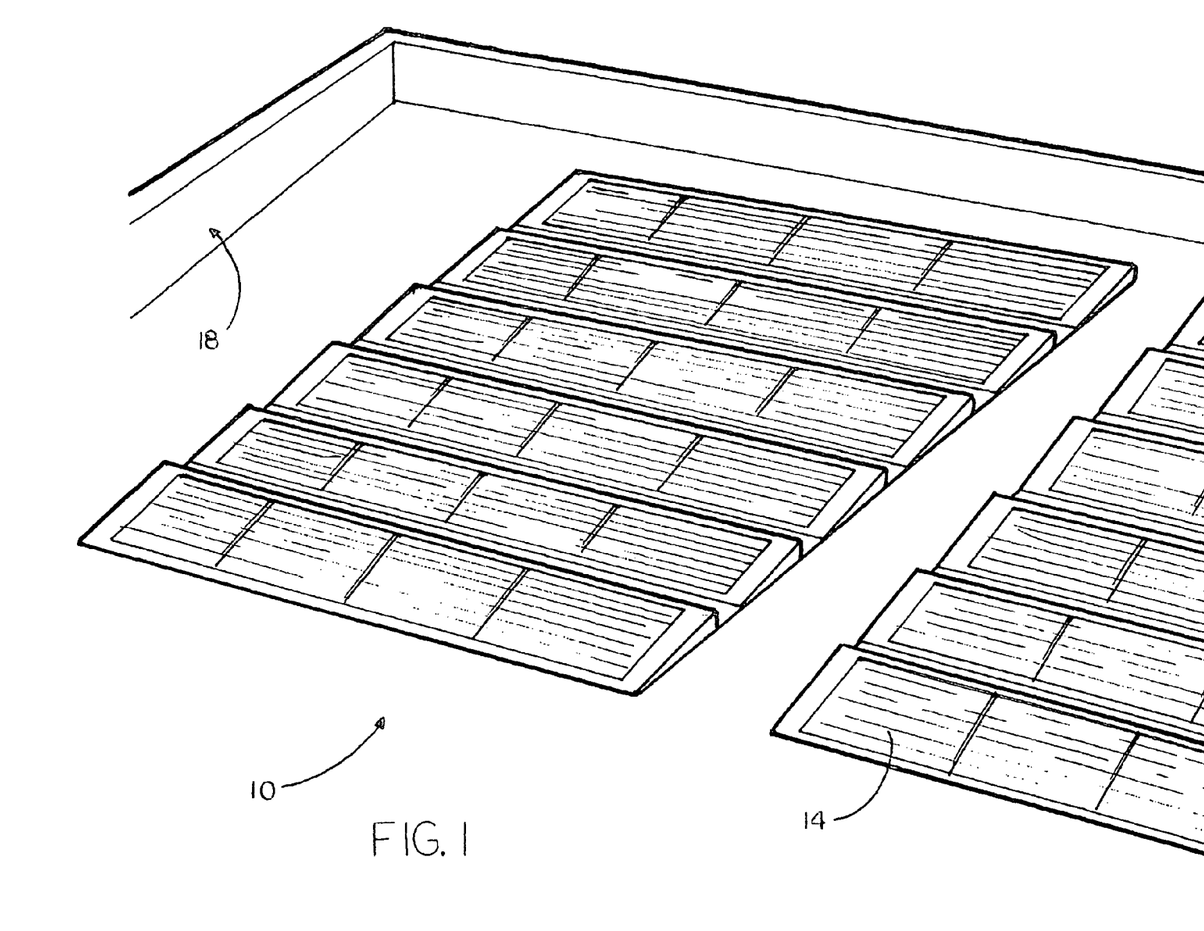
FIG. 1 depicts exemplary embodiments of the photovoltaic membrane assembly as it may be coupled with the envelope of a building.
Figure 2A:
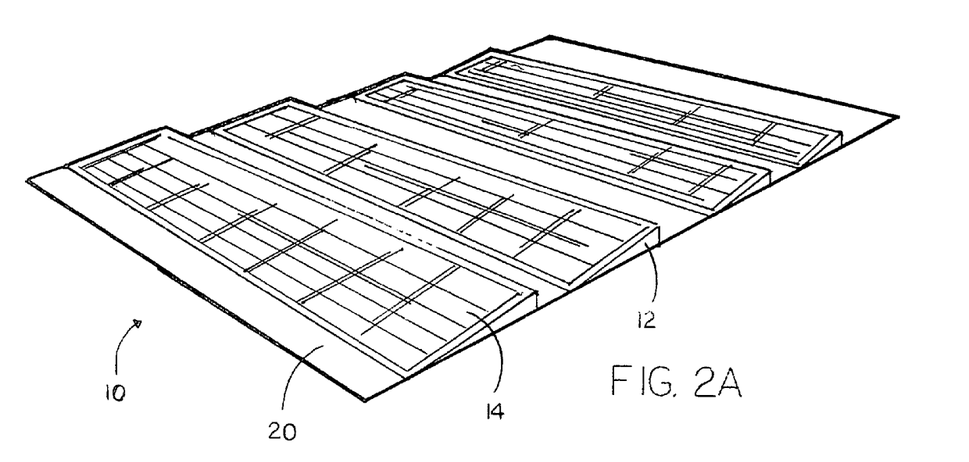
FIG. 2A depicts a preassembled embodiment of the photovoltaic membrane system.
Figure 2B:
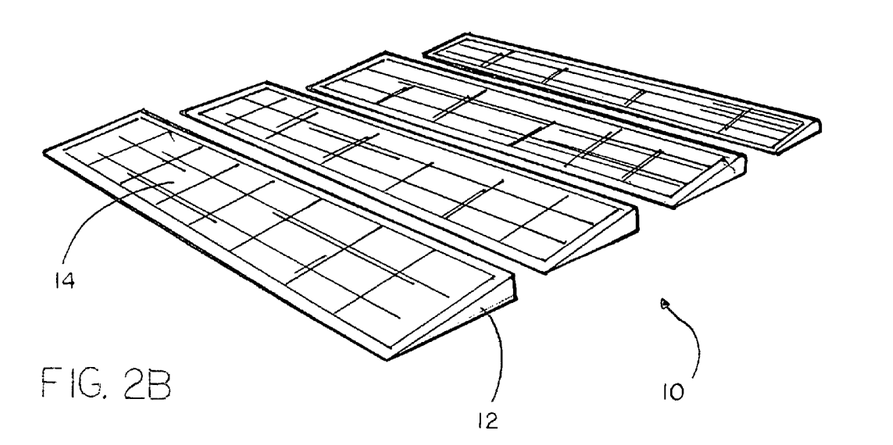
FIG. 2B depicts a modular components of the photovoltaic membrane system before their installation on a building.
Figures 3A, 3B:
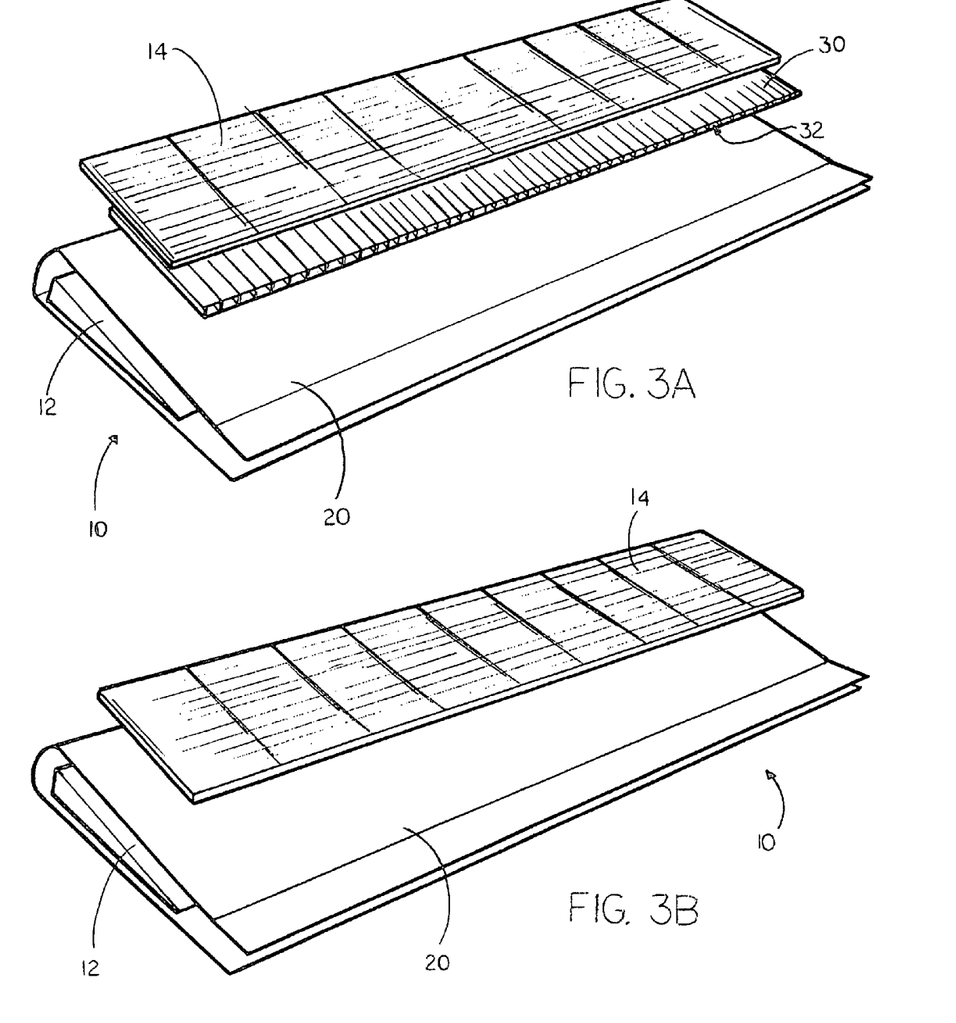
FIG. 3A depicts a partially exploded view of the integrated photovoltaic membrane system with an air channel assembly.
FIG. 3B depicts a partially exploded view of the photovoltaic membrane system without an air channel assembly.
Figure 4A:
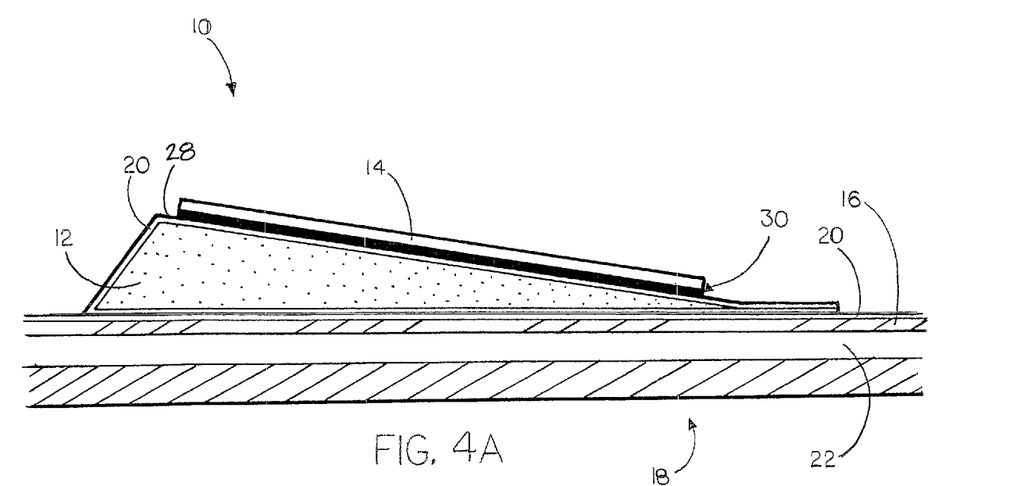
FIG. 4A depicts a cut-away, side elevation view of the photovoltaic membrane system depicted in FIG. 3A.
Figure 4B:
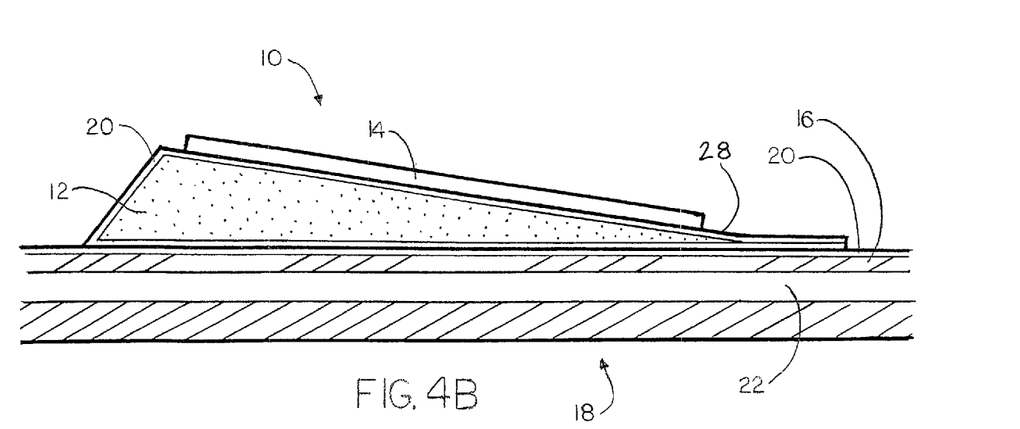
FIG. 4B depicts a cut-away, side elevation view of the photovoltaic membrane system depicted in FIG. 3B.
Figures 5A, 5B, 5C, 5D:
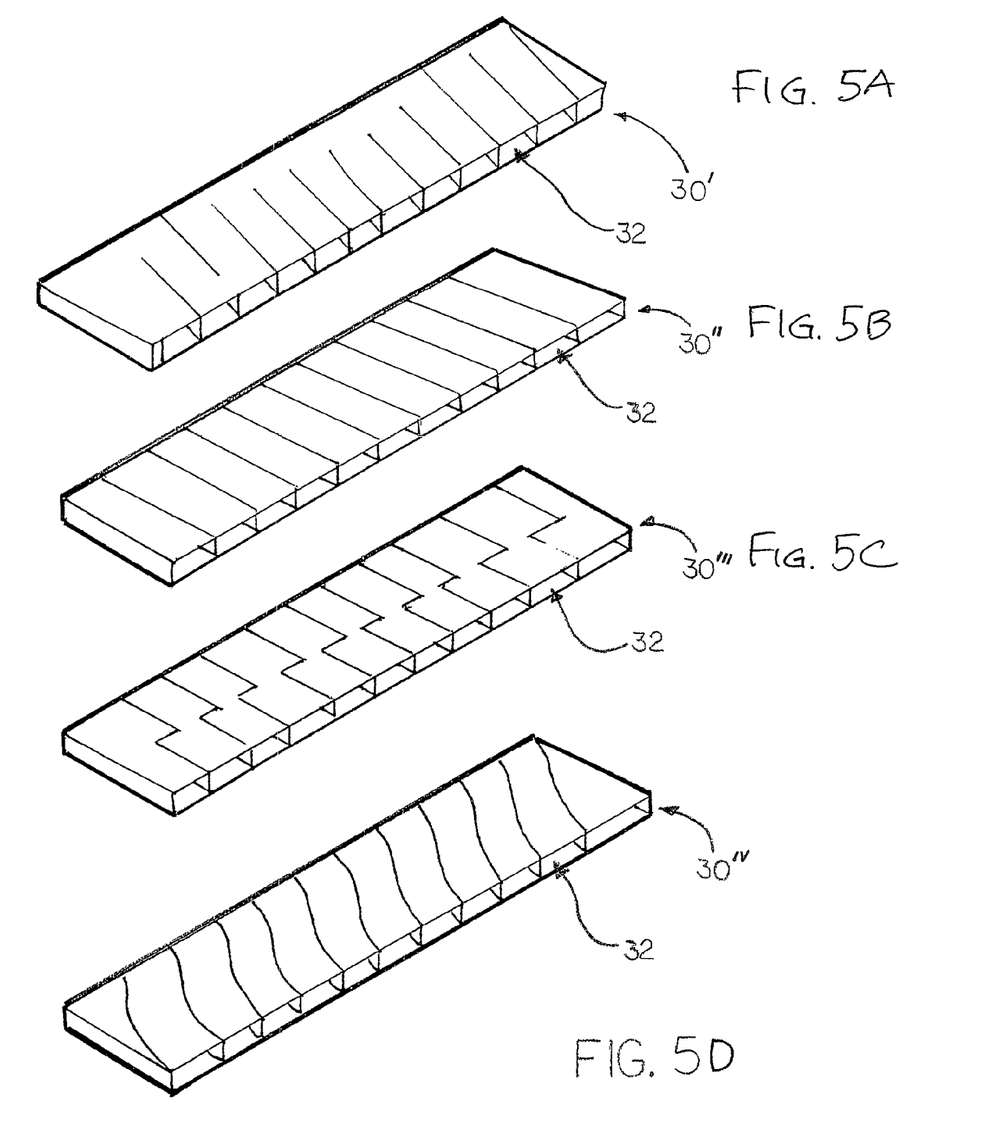
FIGS. 5A-5D depicts various embodiments of air channels that may be incorporated with the photovoltaic membrane system.

In one aspect, the thermal protection afforded by the thermal barrier 12 may be increased by providing an air channel assembly 30. With reference to FIGS. 3A, 4A and 5, an air channel assembly 30 may be provided between the photovoltaic cells 14 and the thermal barrier 12. In one embodiment, the air channel assembly 30 is provided to form a physical air space between the photovoltaic cells 14 and the thermal barrier 12. Air within the air channel assembly 30 serves as an insulative layer that inhibits the transfer of heat from the underside of the photovoltaic cells 14 to the thermal barrier 12. However, in another aspect, the air channel assembly 30 is provided with one or more openings 32 that promote the expulsion of heated air away from the photovoltaic membrane system 10 and the building 18.

Generally, the air channel assembly 30 may be formed to provide protective air gaps, cavities or spaces that allow ventilation and circulation behind the photovoltaic cells 14. The specific configuration of the channels within the air channel assembly 30 may vary from one embodiment to another to accommodate particular design considerations. Various design considerations may, for example call to confuse, deflect and reduce wind uplift forces that engage the photovoltaic membrane system 10. Heated air within the air channel assembly 30 will tend to dissipate through the openings 32 naturally by convection. In the end, the combination of the air channel assembly 30 with the thermal barrier 12 will increase the electrical output of the photovoltaic cells 14 by keeping them cooler. Perhaps more importantly, however, these structures will help alleviate the damaging effects of heat being trapped against one or more components to the building envelope, such as roof membrane systems 20.

In one aspect, thermal energy may also be captured from the photovoltaic cells 14 using the air channel assembly 30. Rather than expelling the heated air from the air channel assembly openings 32, the thermal energy within the air channel assembly 30 may be redirected for use within the building energy system. For example, heated air may be directed into the building 18 during winter months. In another aspect, the heated ambient air may be used as a heat exchanger to pre-warm water for use within the building 18.

It is contemplated that the photovoltaic system 10 may be attached to a roof membrane material 20 in the factory or on a job site in the field. For example, the rows of photovoltaic cells 14 may be pre-attached to a roof membrane material 20 in a strip format. Providing photovoltaic membrane strips of this nature will limit installation decisions at job sites by roofers and speed the installation of the system. However, in various situations, preassembly may not be preferred, including custom roofing applications. In such instances, roofing membrane material 20 may be pre-marked with indelible ink, paint, adhesive or scored to provide direction as to where to attach the photovoltaic cells 14.

In attaching the photovoltaic membrane system 10 with a roof, a variety of attachment methods may be employed that are currently used for installing traditional roof membrane systems. For example, the system may be coupled with the roof using mechanical fasteners. Other techniques, such as heat-welding methods, glues, pressure-sensitive or peel-and-stick adhesives may be used. In still other embodiments, the photovoltaic membrane system 10 may be ballasted to the top surface of the roofing membrane 20, insulation board 22 or fastened directly to the roof deck 16.

It is contemplated that the photovoltaic membrane system 10 may be provided as a permanent installation or made a part of a temporary, removable photovoltaic system. Specifically, the photovoltaic membrane system 10 may be fully integrated as the roof membrane layer 20 or with one or more roof membrane layers 20 of the building envelope. Where provided in a removable fashion, the photovoltaic membrane system 10 may be ideal for use as a portable power supply or removable personal property equipment for power purchase agreements. Various possibilities for temporary attachment include the use of ballasting techniques or anchoring the system in place between the rows and along perimeter PVC pipes or other polymer extrusion. The system may also be anchored over the rows. It is further contemplated that other fastening methods may be used, including the use of grommets attached with cables or guy wires to perimeter parapet walls or to anchors in roof.

The technology of the present system is applicable to all photovoltaic technologies including but not limited to individual cells or layered cells comprising of single crystalline silicon, polycrystalline silicon and amorphous silicon, gallium arsenide, copper indium diselenide, cadmium telluride, dye-sensitive and nano-technologies. It is contemplated that one or more embodiments may further incorporate the use of thin film and organic photovoltaic technologies, developed as paint or film coatings instead of separate photovoltaic cells, laminates or modules.

Although the above embodiments have been described in language that is specific to certain structures and methodological steps, it is to be understood that the invention defined in the appended claims is not necessarily limited to the specific structures and/or steps described. Rather, the specific aspects and steps are described as forms of implementing the claimed invention. Since many embodiments of the invention can be practiced without departing from the spirit and scope of the invention, the invention resides in the claims hereinafter appended.

What is claimed is:

1. A photovoltaic module for use on the roof of a building that includes a roof deck and a layer of roofing membrane material, the module comprising:
    at least one photovoltaic cell;
    a thermal barrier disposed between said at least one photovoltaic cell and the roof deck of the roof so that the thermal barrier isolates the at least one photovoltaic cell from the roof deck; said thermal barrier being comprised of a material that substantially inhibits thermal transmission from the at least one photovoltaic cell to the roof deck;
    a first roof membrane layer disposed between said at least one photovoltaic cell and said thermal barrier;
    a second roof membrane layer disposed between said thermal barrier and the layer of roofing membrane material of the roof; and
    an air channel between said at least one photovoltaic cell and said thermal barrier.

2. The module of claim 1 wherein said air channel comprises an air channel assembly disposed between said at least one photovoltaic cell and said thermal barrier;
    said air channel assembly having at least one air channel that is positioned to direct heated air within said air channel assembly away from the photovoltaic module and the roof deck.

3. The module of claim 1 further comprising a layer of reflective material disposed between said at least one photovoltaic module and said thermal barrier.

4. The module of claim 3 wherein said reflective material provides a white reflective surface.

5. The module of claim 3 wherein said reflective material is comprised of a reflective metal material.

6. The module of claim 1 wherein said thermal barrier is disposed closely adjacent the roof deck.

7. The module of claim 1 wherein the thermal barrier beneath said at least one photovoltaic cell is wedge-shaped.

8. The module of claim 7 wherein the wedge-shape of said thermal barrier is provided to increase the electrical performance of the photovoltaic cells by directing them into the path of solar rays;
   exterior perimeter walls of the thermal barrier are aerodynamically shaped to promote airflow around the system.

9. The module of claim 1 wherein said thermal barrier is pre-assembled between said at least one photovoltaic cell and said second roof membrane layer prior to attachment of the photovoltaic membrane system to the roof.

10. In combination:
   a building having a building envelope that includes a roof deck and a layer of roofing membrane material;
   at least one photovoltaic cell; and
   a thermal barrier disposed between said at least one photovoltaic cell and the roof deck of the roof so that the thermal barrier is associated with the building envelope while isolating the at least one photovoltaic cell from the building envelope; said thermal barrier having upper and lower surfaces and being comprised of a material that substantially inhibits thermal transmission from the at least one photovoltaic cell to the building envelope;
   a roof membrane layer extending along said lower surface and including at least one fold whereby said roof membrane layer also extends along said upper surface; and
   an air channel assembly disposed between said at least one photovoltaic cell and said thermal barrier.

11. The combination of claim 10 wherein said air channel assembly having at least one air channel that is positioned to direct heated air within said air channel assembly away from the building envelope.

12. The module of claim 1, wherein said first roof membrane layer comprises reflective material.

13. The module of claim 1, wherein said first and second roof membrane layers comprise a single layer extending along an upper and lower surface of said thermal barrier.

14. The module of claim 13, wherein said single layer includes first and second ends, and wherein said first and second ends overlap to form a tab.

15. A photovoltaic membrane system for use on the roof of a building that includes a roof deck, the system comprising:
   a layer of roofing membrane material;
   at least one photovoltaic cell;
   a thermal barrier disposed between said at least one photovoltaic cell and said layer of roofing membrane material so that the thermal barrier isolates the at least one photovoltaic cell from the roof deck;
   a first roof membrane layer disposed between said at least one photovoltaic cell and said thermal barrier;
   a second roof membrane layer disposed between said thermal barrier and said layer of roofing membrane material; and
   an air channel between said at least one photovoltaic cell and said thermal barrier.

16. The system of claim 15, wherein said first and second roof membrane layers comprise a single layer extending around said thermal barrier.

\* \* \* \* \*